(12) United States Patent
Goergens et al.

(10) Patent No.: US 7,378,001 B2
(45) Date of Patent: May 27, 2008

(54) MAGNETRON SPUTTERING

(75) Inventors: Carsten Goergens, Dresden (DE); Stephen Robert Burgess, Ebbw Vale (GB)

(73) Assignee: Aviza Europe Limited, Newport, Gwent (GB)

( * ) Notice: Subject to any disclaimer, the term of this patent is extended or adjusted under 35 U.S.C. 154(b) by 0 days.

(21) Appl. No.: 10/275,439

(22) PCT Filed: Jul. 18, 2001

(86) PCT No.: PCT/GB01/03229

§ 371 (c)(1),
(2), (4) Date: Nov. 6, 2002

(87) PCT Pub. No.: WO02/11176

PCT Pub. Date: Feb. 7, 2002

(65) Prior Publication Data

US 2004/0099524 A1 May 27, 2004

(30) Foreign Application Priority Data

Jul. 27, 2000 (GB) ................................. 0018391.3
Sep. 5, 2000 (GB) ................................. 0021754.7

(51) Int. Cl.
C23C 14/35 (2006.01)

(52) U.S. Cl. .......................... 204/192.12; 204/192.13; 204/298.03; 204/298.16; 204/298.19; 204/298.2

(58) Field of Classification Search ........... 204/192.12, 204/298.16, 298.17, 298.18, 298.19, 298.2, 204/192.13, 298.03

See application file for complete search history.

(56) References Cited

U.S. PATENT DOCUMENTS

| 4,761,218 A | 8/1988 | Boys | 204/298.19 |
| 4,865,712 A * | 9/1989 | Mintz | 204/298.16 |
| 4,880,515 A | 11/1989 | Yoshikawa et al. | 204/192.12 |
| 5,182,001 A | 1/1993 | Fritsche et al. | 204/192.12 |
| 5,417,834 A | 5/1995 | Latz | 204/298.11 |
| 5,496,455 A * | 3/1996 | Dill et al. | 204/192.12 |
| 5,589,039 A | 12/1996 | Hsu | 204/192.12 |
| 5,593,551 A | 1/1997 | Lai | 204/192.12 |
| 5,744,011 A | 4/1998 | Okubo et al. | 204/192.12 |
| 5,772,858 A | 6/1998 | Tepman | 204/192.12 |
| 6,183,614 B1 | 2/2001 | Fu | 204/298.2 |
| 6,228,236 B1 | 5/2001 | Rosenstein et al. | 204/298.2 |
| 6,306,265 B1 * | 10/2001 | Fu et al. | 204/192.12 |
| 6,352,629 B1 * | 3/2002 | Wang | 204/298.2 |

FOREIGN PATENT DOCUMENTS

EP  0 825 277 A2  2/1998

(Continued)

*Primary Examiner*—Rodney G McDonald
(74) *Attorney, Agent, or Firm*—Volentine & Whitt, PLLC

(57) ABSTRACT

A magnetron sputtering apparatus has a controller for selectively releasing the spread of plasma on a substrate on a support. The controller can also contain the plasma when the substrate is to be coated with the target material. This enables cleaning of the target surface during intervals between deposition of target material onto a desired substrate, such as a wafer, and ensures that layers or flakes of back-scattered deposited target material do not build up on the target itself. A platen coil is located between the magnetron and the support to increase both uniformity and density of target material arriving nearly normal to the substrate surface.

27 Claims, 9 Drawing Sheets

FOREIGN PATENT DOCUMENTS

| | | |
|---|---|---|
| EP | 1 091 016 A2 | 4/2001 |
| GB | 2 342 927 A | 4/2000 |
| JP | 55031142 | 3/1980 |
| JP | 61-139670 | 6/1986 |
| JP | 62-167877 | 7/1987 |
| JP | 4-116162 | 4/1998 |

* cited by examiner

Fig. 2  Edge of target not eroded. Plasma confined by Secondary Magnetic Field

Fig. 3 Entire Target Surface eroded. No Secondary Magnetic Field

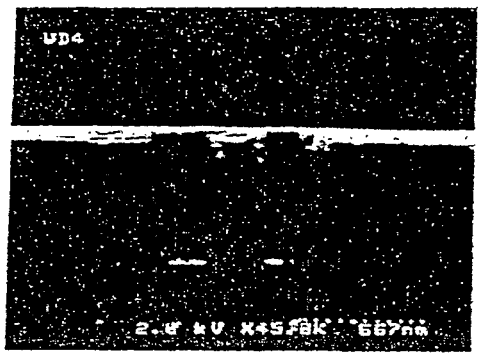
(a) Centre             (b) Edge
*Fig. 5* (no coil power)
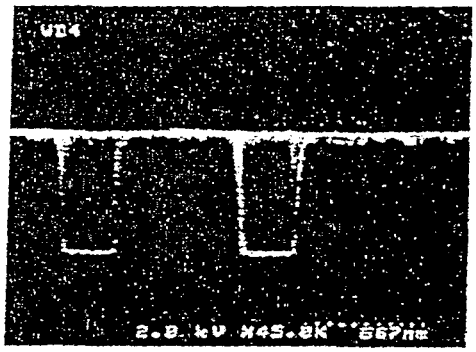
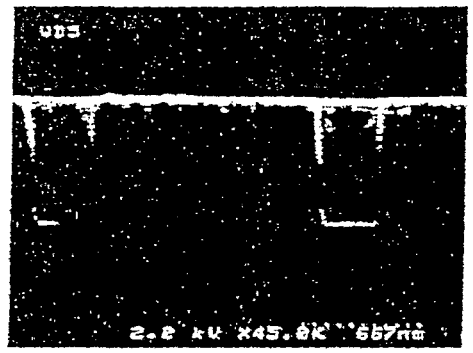
(a) Centre             (b) Edge
*Fig. 6* (target coil power only)
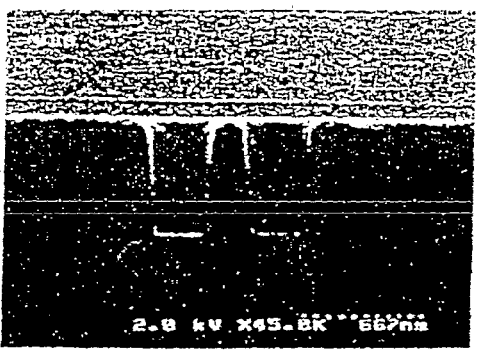
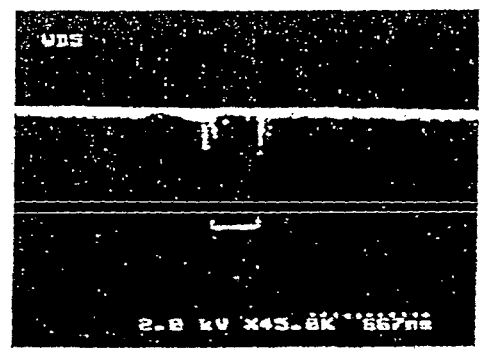
(a) Centre             (b) Edge
(target and coil power, coils energized to given the same magnetic pole to the centre, target coil in a 'buckling' i.e. magnetic polar opposition to the target magnetron)
*Fig 7*

MAGNETRON SPUTTERING

BACKGROUND OF THE INVENTION

This invention relates to apparatus and methods for magnetron sputtering.

In U.S. Pat. No. 5,593,551 issued to Lai, the disclosure of which is incorporated herein by reference, there is described an apparatus and method for magnetron sputtering in which a first closed-loop magnet means is positioned adjacent to a dish-shaped sputter target back surface for creating a closed-loop magnetic tunnel to the front surface of the sputter target, the magnet means being in the form of a plurality of magnets surrounding a central axis of a dish-shaped sputter target for containing and guiding a plasma relative to a substrate. The improvement is a second closed-loop magnet means positioned around the sputter target perimeter and being comprised of a number of bucking magnets, which may be permanent magnets or electro magnets, which collectively provide a fixed field around the sputter target to thereby reduce or inhibit the spreading of the discharge track of the plasma beyond the edge of the target as the operating pressure of the sputtering system is reduced.

The second closed-loop magnet means solves the problem in that the voltage at which a magnetron operates is primarily a function of the ease of ionisation. It is, in turn, a function of the gas, its pressure, the applied voltage, the strength of the magnetic field and the ionisation losses from the plasma. As pressure is dropped so operating voltages rise until practical limits are reached e.g. the power supply or electrical connections to the target.

Extremely high voltages are undesirable as they cause the plasma to emit higher energy electromagnetic waves that are potentially dangerous. Therefore, work has concentrated upon reduction of losses from the plasma by e.g. operating the plasma in an enclosed area bounded by a bucking arrangement, as in the '551 patent. This allows magnetron operation at pressures of 0.1 mT to 1 mT. This low pressure operation is beneficial as a means of improving step coverage.

However, the design of this system and method of sputtering has the disadvantage that due to the confinement of the primary magnetic field by the secondary magnetic field, there is little or zero erosion of the target material around the periphery of the target. As a consequence, the periphery thereof can thereafter be contaminated by back scattered deposits of eroded material, such as atoms or molecules. This re-deposited material generally does not adhere well to the otherwise clean periphery of the target and can thereafter flake off to contaminate the substrate to which a thin film of the material is being applied or is to be applied.

SUMMARY OF THE INVENTION

The present invention is derived from the realisation that by replacing the permanent bucking arrangement of the prior art, which essentially provides a fixed magnetic field normal to the erosion region, with controllable DC coils located adjacent but outside of the periphery of the target assembly, it is then possible to vary the magnetic field, through the use of suitable switching and control circuits, to mitigate the foregoing disadvantages and to "clean" the whole of the target surface before a new thin film process is begun.

According to a first aspect of the invention there is provided a magnetron sputtering apparatus including:
a target;
a magnetron assembly for the target arranged to produce uniform erosion of the target across its surface, and
a support for holding a substrate on to which a film of target material is to be deposited from the target, characterised in that the apparatus further includes:
a closed loop magnet assembly located around the sputter target perimeter for magnetically containing or restricting a plasma formed adjacent to the target surface to alter the erosion pattern of the target, and
a control for selectively releasing the spread of the plasma over substantially the entire surface of the target such that the surface thereof may be eroded and selectively containing the plasma within the periphery of the target.

Prior art magnetron devices have been developed to provide good uniform erosion of the target but embodiments of the present invention allow preferential erosion during deposition whilst further allowing the apparatus to operate in the normal mode for cleaning. With this arrangement, sputtering apparatus according to the invention enables cleaning of the target surface during intervals between deposition of target material onto a desired substrate, such as a wafer. This ensures that layers or flakes of back scattered deposited target material do not build up on the target itself to thereafter e.g. flake off and contaminate the wafer.

According to a second aspect of the invention there is provided a method of magnetron sputtering a target by using apparatus in accordance with the first aspect of the invention, which method includes the steps of selectively varying or eliminating the magnetic field provided by the coils to allow thereby the plasma to erode the entire surface of the target material when a substrate material to be coated is not being exposed to the sputtered particles, to thereby prevent build up of unwanted layers or flakes of the target material around the periphery thereof.

According to another aspect, the invention provides a method of sputter deposition on a substrate without collimation filter including, during sputter deposition, restricting the plasma to a central area of a target by means of a circumjacent coil, and
applying a magnetic containment field around a space located above a support for a substrate to be sputtered.

According to a further aspect there is provided a method of controlling a magnetron sputtering assembly having a target having a sputter surface, the magnet of the magnetron assembly being moveable with respect to the target and having a plasma generator and a plasma containment arrangement including operating the plasma containment arrangement in a first, cleaning, mode wherein the plasma extends across substantially the whole sputter surface and a second, deposition mode, when the plasma is contained within the periphery of the sputter surface, and
applying a magnetic containment field around a space located above the support for a substrate to be sputtered.

The inventors have noted that the ability to confine the plasma adjacent a restricted area of target, reduces the angular distribution of the sputter material and, particularly in long throw chambers, can remove the need for collimators even with high aspect ratio holes.

BRIEF DESCRIPTION OF THE DRAWINGS

The invention will now be described, by way of example only, with reference to the accompanying drawings in which:

FIGS. 5(a) and (b) are electron migrographs of the centre and edge respectively of a wafer treated in accordance with Experiment 1;

FIGS. 6(a) and (b) are corresponding micrographs for Experiment 2;

FIGS. 7(a) and (b) are corresponding micrographs for the first set-up in Experiment 3;

FIG. 8 is a plot of base coverage against gas pressure with the target coil on;

DETAILED DESCRIPTION OF THE PREFERRED EMBODIMENTS

Figure 1:
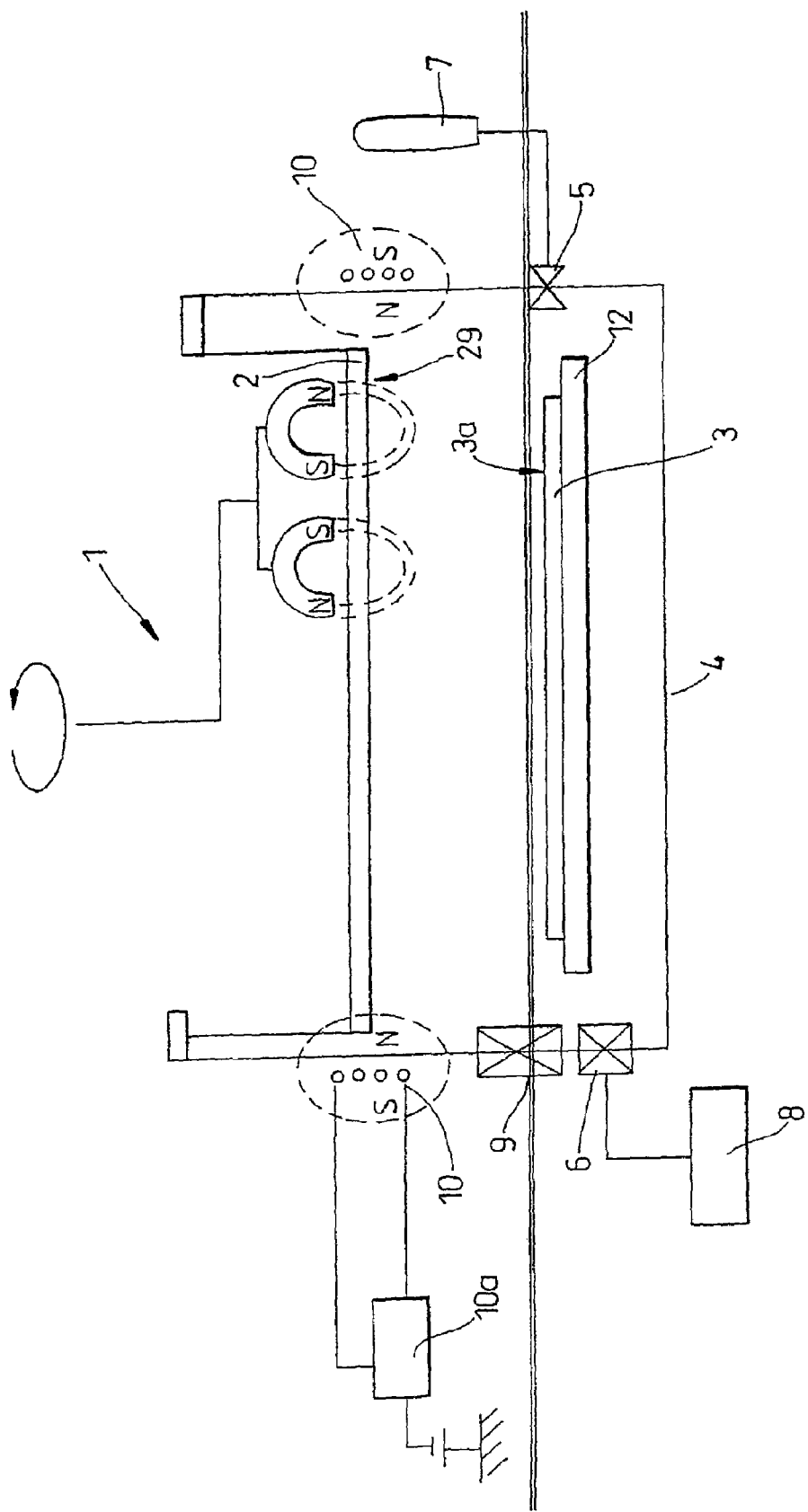
FIG. 1 is a schematic view shown in part cross section of the inside of a sputtering chamber incorporating the apparatus of the invention.

Referring firstly to FIG. 1, there is shown a rotatable magnetron assembly shown generally at 1 comprising a closed loop array of magnets which is used to generate a magnetic field in the volume between the front surface 2a of a target 2, which may typically be titanium and an upper surface 3a of a substrate 3, typically a semi-conducting or insulating wafer.

The target 2 and substrate 3 are each contained within a vacuum low pressure vessel in the form of a chamber 4 through which a stream of noble gas such as argon may pass at low pressure via an inlet valve 5 and an outlet valve 6 from a respective gas source reservoir 7 and a vacuum pump 8, typically a cryogenic pump.

An access door 9 is shown schematically in a side wall of the chamber 4, in order to allow access to the interior of the chamber and in particular for removing at regular intervals a substrate 3 onto which a thin film of the material from the target 2 has condensed following sputtering of the latter via ionic bombardment, in a conventional manner.

Continuously wound DC coils 10 surround the magnetron assembly 1 and lie essentially coplanar with the major plane of the target 2. As will be appreciated, the DC coils 10 can effectively act as a solenoid when excited by a DC current to thereby generate an additional magnetic field, shown in dotted outline, surrounding the magnetron assembly 1 to thereby, when so excited, constitute a bucking arrangement of inwardly facing identical poles.

A control 10a is provided for selective varying the strength of the magnetic field produced by the coils 10 by selectively varying suitable switching and associated software within the control 10, in contrast to the essentially fixed field arrangement shown in the '551 patent. This has a significant advantage in that, prior to the introduction of a substrate into the chamber 3, excitation of the DC coils 10 can be varied to create a wider containment of the surrounding the plasma such that the whole of the lower surface 2a of the target 2 may be sputter etched and thereby cleaned, whereafter the substrate 3 can be introduced into the chamber, the door 9 closed and a smaller containment "bucket" used to contain the plasma by a suitable adjustment to the power supplied to the DC coils 10.

Figure 2:
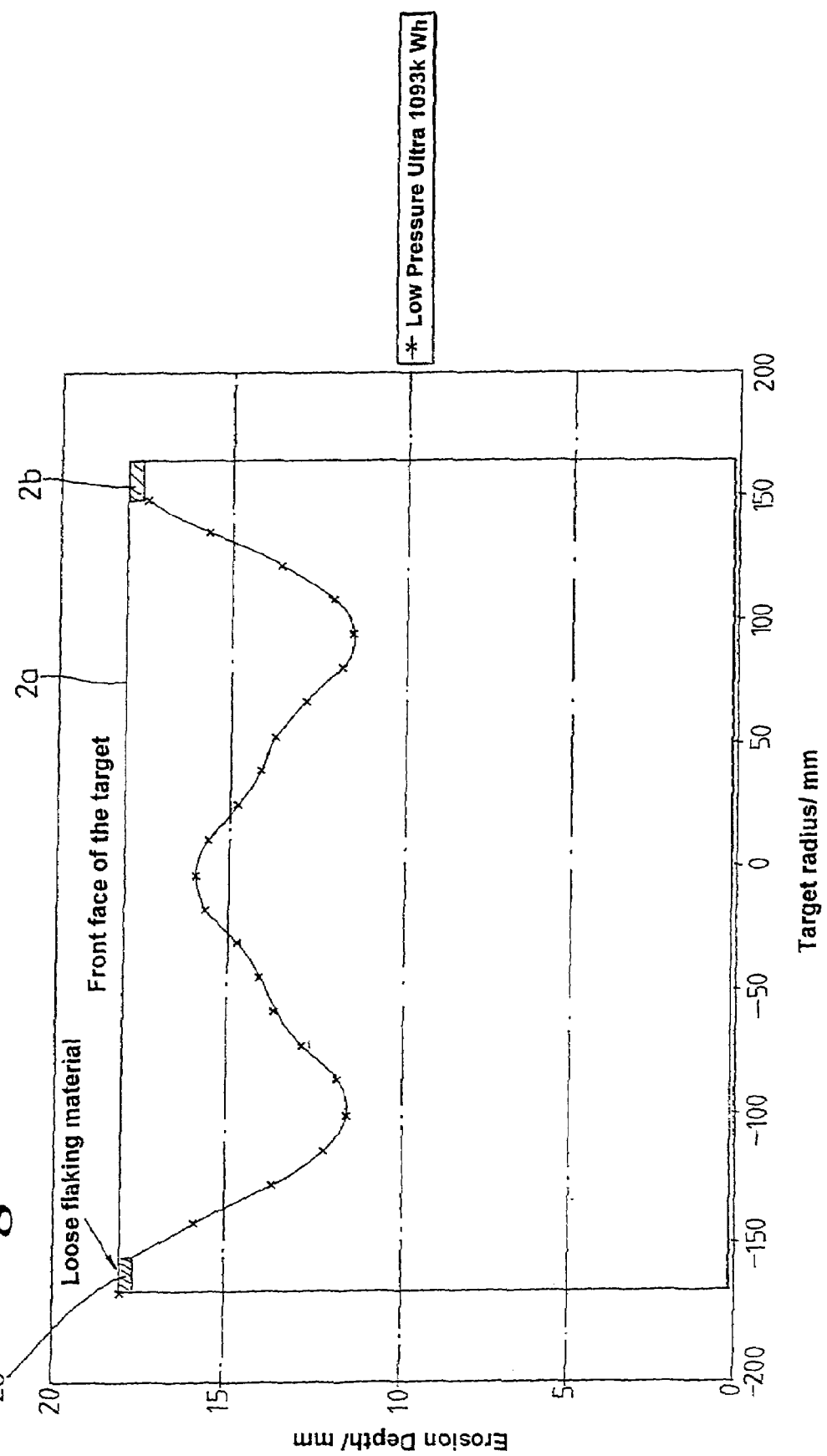
FIG. 2 is a schematic cross-sectional view showing a selected portion of target material of the apparatus of FIG. 1 partially eroded by plasma contained by the second magnet means.

The field intensity produced by the coils 10 may be varied or eliminate altogether, by simply reducing the current thereto in the interval between thin film deposition on a desired substrate 3. This may be demonstrated with reference to FIGS. 2 and 3, with FIG. 2 showing the etching pattern of the target 2 when the DC coils 10 are maintained in a state to contain closely the plasma, e.g.

when they are producing their maximum magnetic field. It will be seen that, an annular perimeter 2b comprised of a layer of re-deposited target material in the form of flakes may therefore build up, as in the apparatus described with reference to the '551 patent.

Figure 3:
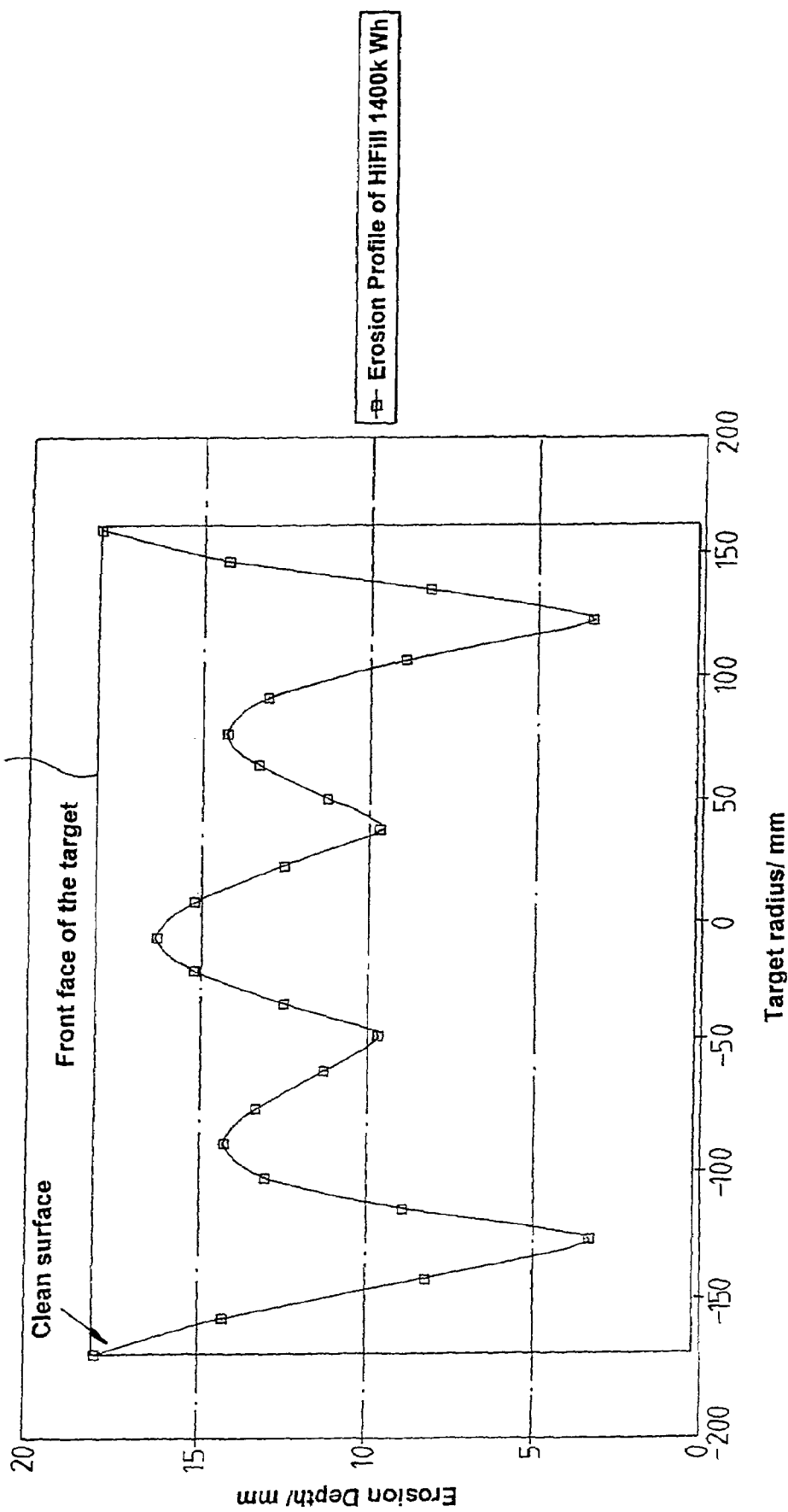
FIG. 3 is a view corresponding to that of FIG. 2 but in which the whole of the surface of one side of the target material has been eroded.

In contrast, and as can be seen in FIG. 3, by varying the magnetic field generated by the DC coils 10 to allow for the whole of the surface 2a of the target to become exposed to ionic bombardment, the whole of the surface may therefore be cleaned.

Variation of the magnetic-field by-the DC coils 10 may also be achieved by reversing the current flow, thereby providing a reversed field.

The cleaning made possible by the present invention is preferably performed at a higher pressure, typically of 1 mT to 10 mT since there are problems with operating the magnetron at low pressure, for the reasons set out in the preamble hereto.

An example of the advantage of the apparatus and method of the invention is found where titanium and titanium nitride is required to be deposited on a substrate as a barrier layer. Economically, it is advantageous to deposit both the titanium and the titanium nitride in the same process chamber and a common practice is to deposit the titanium by sputtering in an inert ambient atmosphere, such as in argon, and for the titanium nitride in a reactive ambient atmosphere, including nitrogen. This technique requires the target to be cleaned after every titanium nitride deposition in order to remove nitrogen contamination from the surface. Using the apparatus and method of the invention there is therefore a very convenient opportunity to clean, additionally, the edge of the target by reducing, removing or reversing the magnetic field generated by the external DC coils 10. A typical sequence would consist of the steps of:

(1) Depositing titanium at low pressure under a high magnetic "bucking" field generated by the external DC coils 10.

(2) when depositing titanium nitride using a high magnetic field again generated by the external DC coils 10, and (3) after removing the substrate, or shielding it from further deposition by use of a shutter, which may also act as a collector for the sputter-cleaned target material, removing, reducing or reversing the field created by the DC coils 10 to thereafter clean the whole of the target surface.

It will, however, be understood that the same sequence described above can be used to deposit these or other metal/metal nitride combinations without departing from the spirit or scope of the invention.

Figure 4:
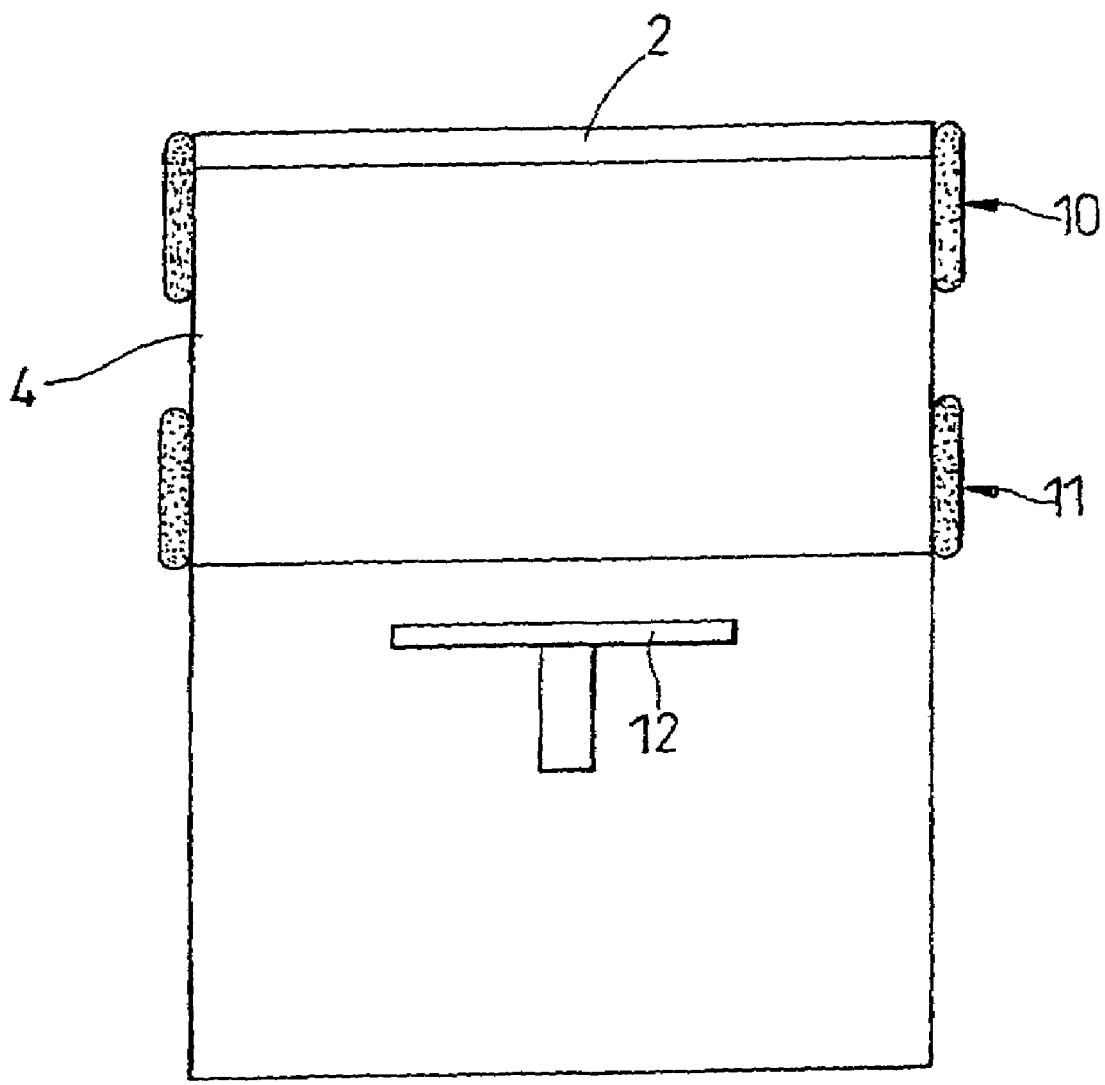
FIG. 4 is a schematic view of an alternative set-up including a further magnetic assembly.

The above results show that the 'target' coil improves base coverage results and it has also been discovered that this can be improved further by the addition of another coil as shown in FIG. 4. This additional platen coil 11 is located between the target and the wafer, but below the 'target' coil.

Before discussing this arrangement in detail, it may be helpful to provide some background explanation. Sputtering so-called 'step coverage' is better than thermal evaporation because of the higher energy level of the arriving material and the possibility of large area sources close to the substrate giving rise to a wide angular distribution of arriving target material. Heating the substrate increases this further. Ideally a conformal surface covering is desired, but the holes present a problem as all material to coat the insides and base must pass through their mouths.

For barrier deposition the only surfaces of interest are within the holes. Ideally none would arrive on the field (an impossibility). For contact barriers, as the contact is at the base of the hole, only the base of the hole requires coating and as contact holes get smaller and aspect ratios increase ideally only the base would be coated, leaving a larger volume of the hole for the principal conductor material having a lower resistance than the barrier material.

So techniques to increase the directionality of the sputtering are employed which attempt to have sputtered material with a flight path normal to the substrate surface thus improving the probability of material deposition at the base of high aspect ratio contact holes.

Two principal techniques are employed: ionisation and collimation. These are not mutually exclusive and ionisation of the sputtered material has been used in combination with 'collimating filters' (being high aspect ratio holes through which sputtered material must pass before arriving at the substrate) and collimation whereby the source to substrate distance is increased e.g. to about 250 mm or about 500 mm (c.f. approximately 25 mm for normal magnetron sputtering). This increased distance allows low angle sputtered material to be lost to the side walls, with only that material arriving approximate normal to the substrate surface to arrive thus increasing the proportion of material deposited at the bottom of holes (which are, in essence, collimation filters themselves).

In the present invention, it could be said that collimation is being achieved, without using an actual collimator, by controlling the source of the sputtered material. The 'target' coil confines the plasma and thus reduces the angular distribution of sputtered material. One surprising result from the experiments shown below is that optical spectroscopy suggests that metal ionisation takes place and thus this arrangement achieves much of that using ionising coils but without the ionising coil. In any event base coverage using this system is significantly affected by the bias voltage on the support.

A further set of experiments investigated the influence of additional electromagnetic coils on the hole base coverage of sputtered titanium films in a 'long throw' magnetron sputter chamber arrangement with an approximate 240 mm source to substrate spacing. 'Long throw' generally indicates a source substrate separation of over about 200 mm.

The set up is indicated in FIG. 4. One set of coils ("target coils") 10 was positioned around the target and upper part of the sputter chamber as shown schematically in FIG. 1. The polarity of the coil current was set to induce a magnetic field with the same direction as the outer pole of the magnetron ("stronger outer poles"). This allows the system to operate at low working gas pressures by confining the plasma at the edge of the target, lowering the plasma impedance.

Additionally, a second set of electromagnetic coils ("platen coils") 11 was positioned around the lower part of the sputter chamber, close to the support 12. The two sets of coils were operated independently using different power supplies. Experiments were run with the coils energised to present different magnetic poles into the sputtering chamber. In general significantly better base coverage was achieved when both the target and platen coil magnetic polarity was opposed to the outer pole of the target magnetron (in a 'bucking' configuration) as shown in experiment 3. So, for the sake of clarity, if the magnetron presented a North pole to its outer periphery, then the coils were generally energised so as to present a North pole on their inner surface. Reversing the magnetic field of the platen coil(s) 11, see experiment 4, (such that they present an opposing magnetic field to the outer field of the magnetron) was found to improve symmetry of base coverage across the wafer; however base coverage thickness was reduced.

Cathode power, sputter gas pressure and deposition temperature were kept constant, whilst the platen bias power and coil currents were varied. The film properties investigated are base coverage (at the center and edge of the wafer) and the asymmetry of the base coverage (across on wafer and within one contact hole).

1. Experimental Process Parameters:

| | |
|---|---|
| Target Power: | 30 kW |
| Ar Gas flow: | 100 sccm |
| Pressure: | 2.5 mTorr |
| Platen Temp.: | 200° C. |
| Size of contact hole: | 2.5 μm, aspect ratio: 2.7:1 |

2. Results and Conclusions

| Experiment 1. | |
|---|---|
| Target Coil Current = | 0A |
| Platen Coil Current = | 0A |
| Platen bias voltage = | −105 V |
| Sputtering efficiency = | 77 Å kW$^{-1}$ min$^{-1}$ |
| Base coverage centre = | 26% |
| Base coverage edge, average = | 25% |
| Asymmetry of base coverage across wafer (max − min)/(max + min) = | 4% |
| Asymmetry of base coverage within one contact (max − min)/(max + min) = | 4% |

The base coverage achieved is shown in the electron micrographs shown in FIG. 5.

| Experiment 2 | |
|---|---|
| Target Coil Current = | 17 0A |
| Platen Coil Current = | 0A |
| Platen bias voltage = | −105 V |
| Sputtering efficiency = | 45 Å kW$^{-1}$min$^{-1}$ |
| Base coverage centre = | 63% |
| Base coverage edge, average = | 51% |
| Asymmetry of base coverage across wafer (max − min)/(max + min) = | 19% |
| Asymmetry of base coverage within one contact (max − min)/(max + min) = | 15% |

The base coverage achieved is shown in the electron micrographs shown in FIG. 6.

| | Experiment | |
|---|---|---|
| | 3 | 4 Reversed Platen Mag field |
| Target Coil Current = | 17 OA | 17 OA |
| Platen Coil Current = | 4 OA | 4 OA |
| Platen bias voltage = | −90 V | −125 V |
| Sputtering efficiency Å $kW^{-1}$ $min^{-1}$ = | 41 | 42 |
| Base coverage centre = | 70% | 45% |
| Base coverage edge, average = | 59% | 48% |
| Asymmetry of base coverage across wafer (max − min)/(max + min) = | 11% | 5% |
| Asymmetry of base coverage within one contact (max − min)/(max + min) = | 5% | 1% |

The base coverage achieved in experiment 3 is shown in the electron micrographs shown in FIG. 7.

The reversed magnetic field experiment 4, in which only the field in the platen coils is reversed, is not entirely comparable. The system has power control for substrate bias, yet sputtering is voltage not current driven.

Anything over 100V is likely to cause significant resputtering, perhaps resputtering material on the base of holes onto the sidewalls. (No micrographs for reverse magnetic field shown here).

| | Experiment | |
|---|---|---|
| (d) | 5 | 6 Reversed Platen Mag field |
| Target Coil Current = | OA | OA |
| Platen Coil Current = | 17 OA | 17 OA |
| Platen bias voltage = | −110 V | −160 V |
| Sputtering efficiency Å $kW^{-1}$ $min^{-1}$ = | 93 | 82 |
| Base coverage centre = | 59% | 23% |
| Base coverage edge, average = | 43% | 19% |
| Asymmetry of base coverage across wafer (max − min)/(max + min) = | 16% | 5% |
| Asymmetry of base coverage within one contact (max − min)/(max + min) = | 1% | 12% |

Again these experiments and in particular the reversed magnetic field experiment is not entirely comparable. The system has power control for substrate bias, yet sputtering is voltage not current driven. Anything over −100 V is likely to cause significant resputtering, perhaps resputtering material on the base of holes onto the sidewalls. No micrographs for this experiment shown here. Further experiments are required keeping bias to a =/<−100 v threshold.

When comparing FIG. 5 and FIG. 6, it is apparent that the addition of 'target coils' improves the base coverage of the sputtered films at the centre as well as at the edge of the wafer by more than 50%

A drawback, however is the 3 to 4-fold increase in asymmetry of the base coverage, across the wafer as well as within a contact hole. This increase in asymmetry can however be significantly reduced by addition of platen coils 11 (FIG. 4). These 'platen' coils 11 increase both uniformity (reduced asymmetry) and density of target material arriving nearly normal to the substrate surface (increased hole base coverage). Reversing the magnetic pole of the platen coil further increases symmetry across the wafer but at a reduced base coverage.

It is also noted that sputtering efficiency falls when the 'target' magnetic coils are used. This is a measure of the average material thickness upon the wafer per target kilowatts of power per minute. It may be that confinement of target plasma (of comparable power) to a smaller area increases plasma density sufficiently to significantly increase ionisation of sputtered material, but at the cost of a reduced sputtering rate due to the reduction in target area erosion due to reduced area of target exposed to plasma. Thus less material is being sputtered, but at a higher energy level.

As has been mentioned before it is believed that metal ionisation is taking place as a result of this new configuration. Whilst it appears desirable to ionise an amount of the sputter material, complete ionisation will not usually be appropriate.

Figure 8:
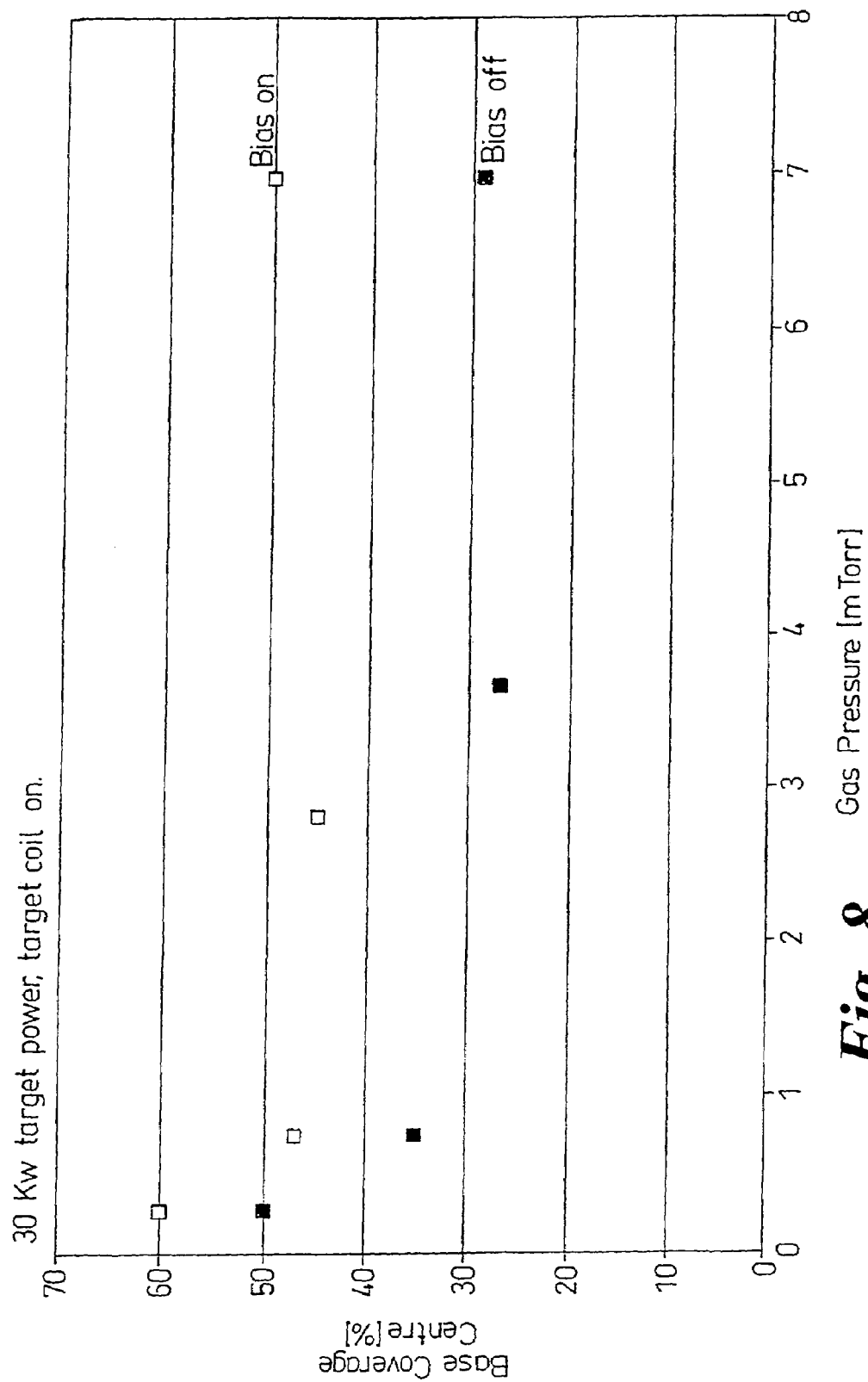
Figure 9:
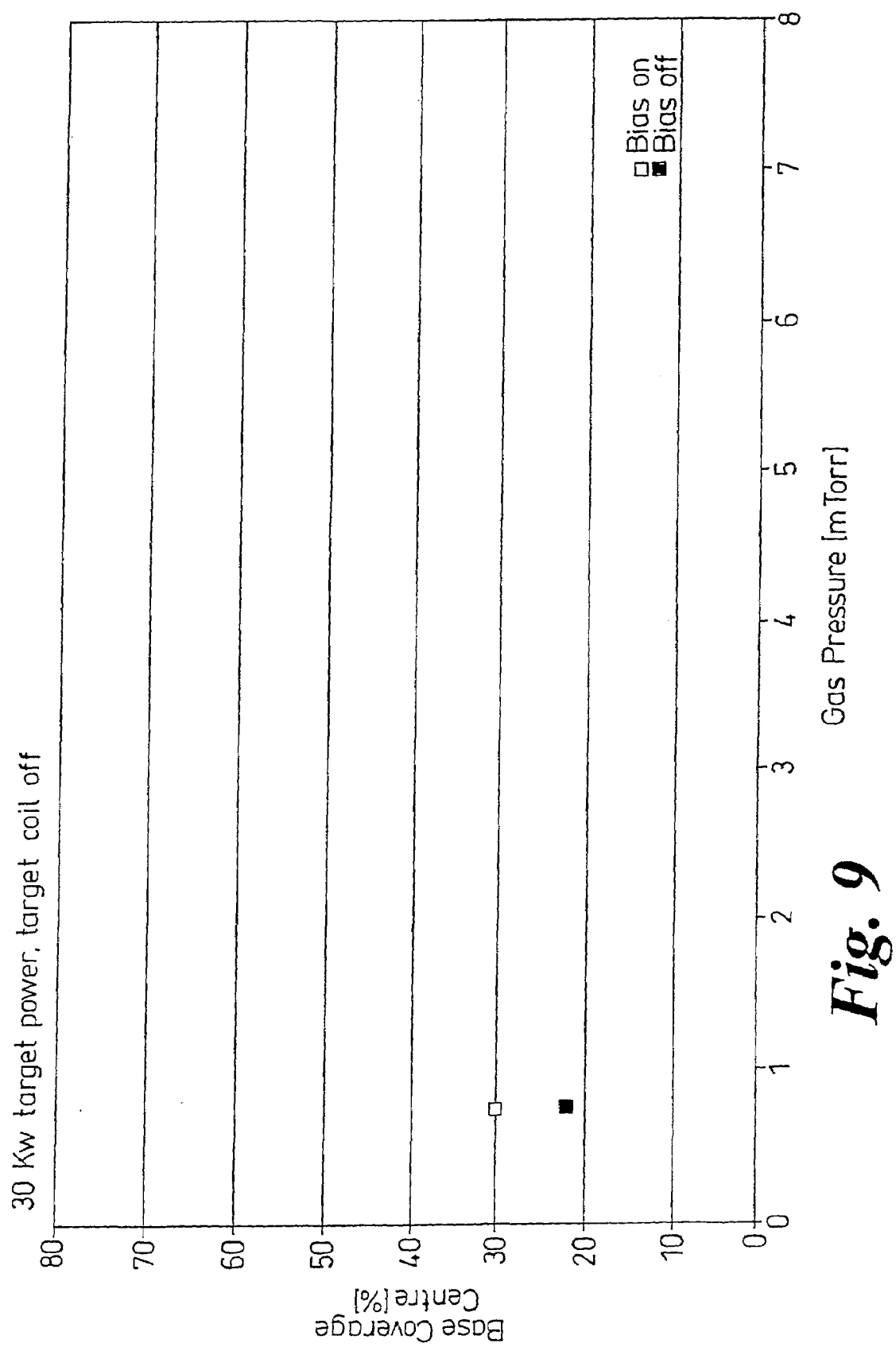
FIG. 9 is a similar plot to FIG. 8 with the target coil off.

The evidence for this is as follows:

This improvement in base coverage is gas pressure insensitive. See attached FIGS. 8 and 9. Whilst turning the bias on at 1 millitorr has a similar percentile improvement in both cases, it is felt that the fact that the bias 'on' improvement is pressure insensitive shows that there is a significant degree of metal ionization. This is extremely unusual for magnetrons that are generally considered to produce insignificant amount of metal ions, thus internal RF driven ionizing coils are usually required.

Figure 10:
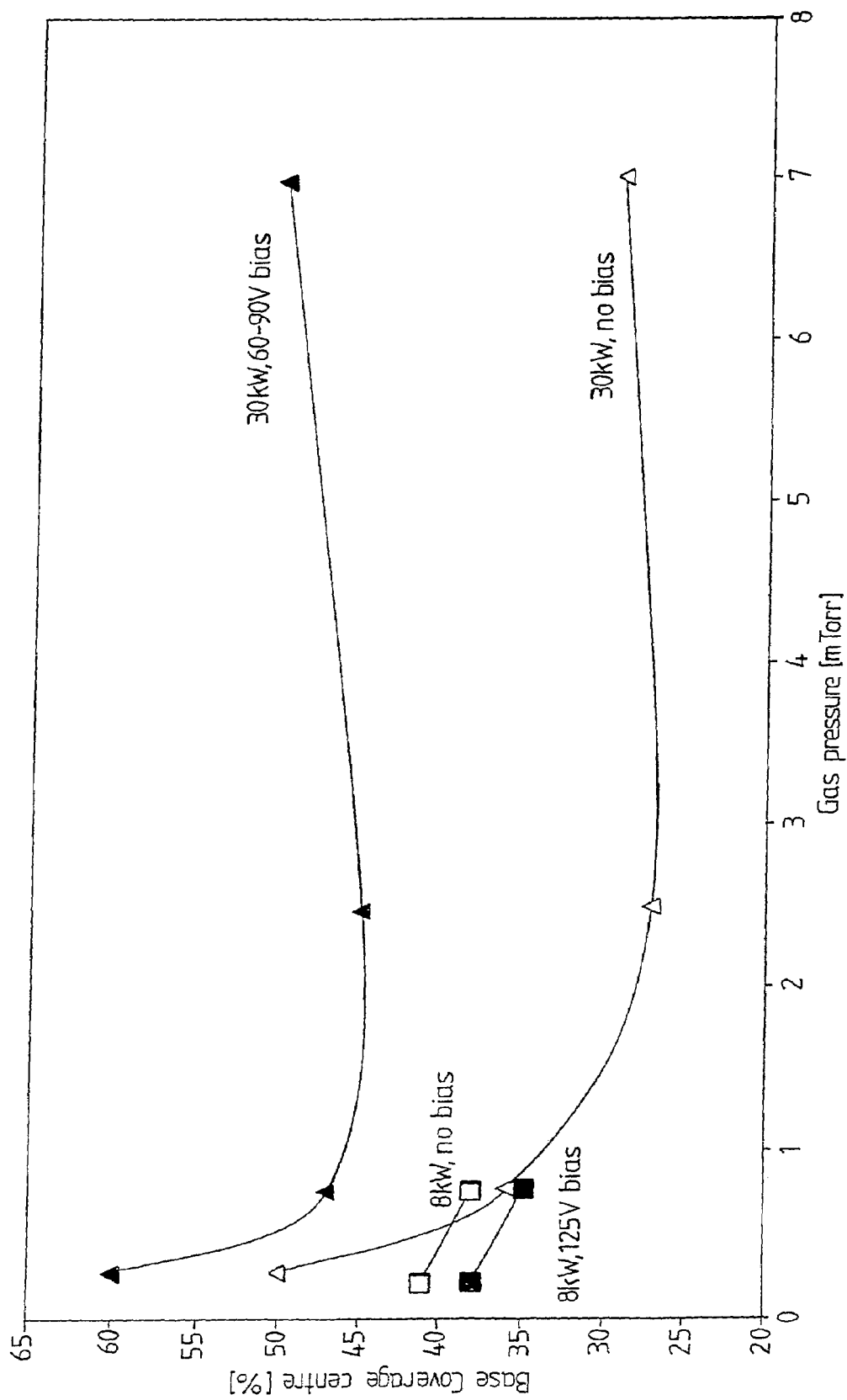
FIGS. 10 and 11 are further such plots for different bias conditions at the centre and edge respectively.
Figure 11:
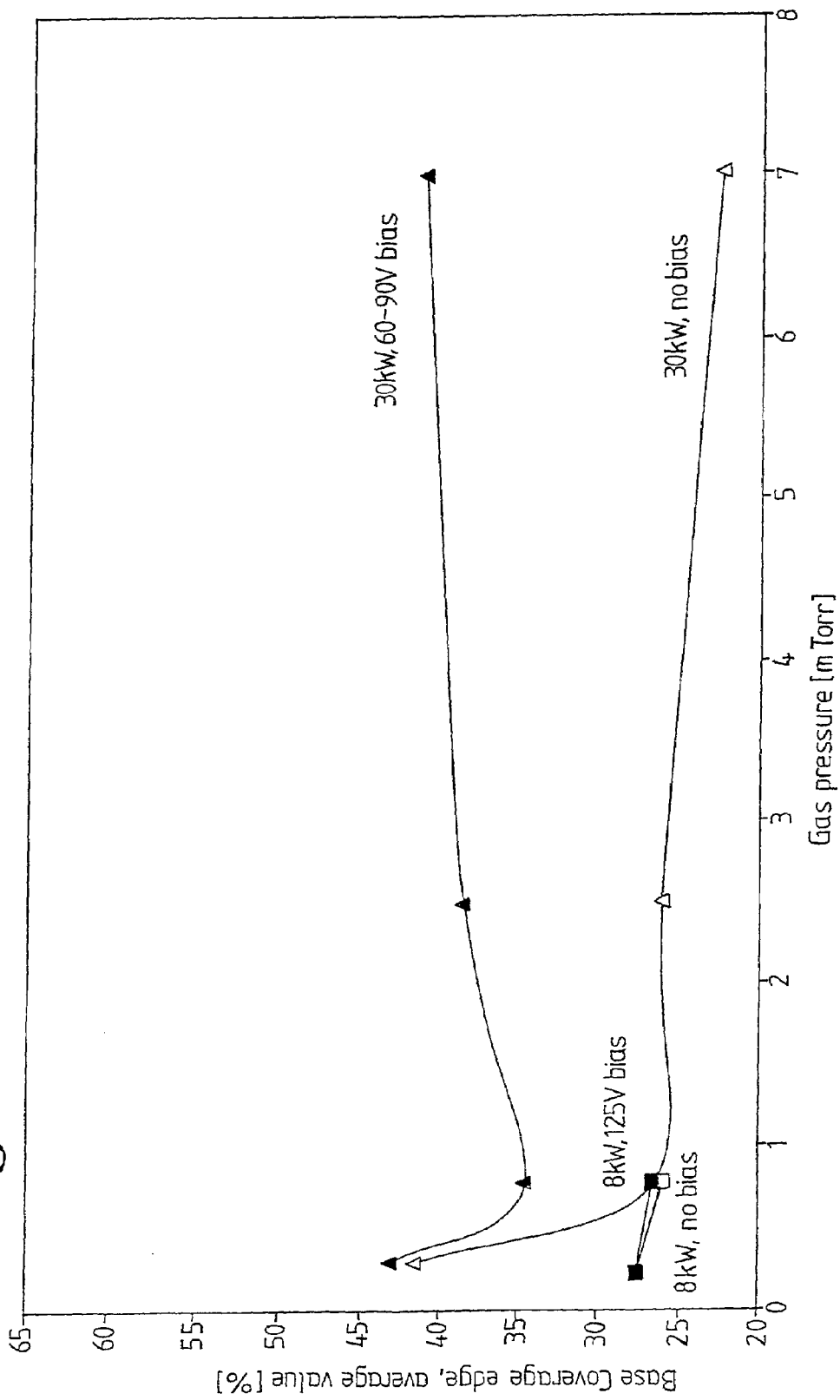

It would appear that by confining the plasma and applying high levels of power to the magnetron at the 'right' pressure regime, metal ionisation is caused in the absence of a separate ionizing source. The addition of a further coil between the "target" coil and the substrate further improves base coverage and symmetry of base coverage across a wafer. Whilst these have been identified as two discrete D.C. coil assemblies in this disclosure, they may be one assembly with varied winding densities to provide a graded magnetic field strength between the target area and the substrate area of the chamber. The experiments appear to show that metal ionization occurs at high magnetron power levels only. At lower magnetron power levels, base coverage is poorer, see FIGS. 10 (center) and 11 (edge) These experiments were conducted with only the target coil energized. They show the influence on hole base coverage of wafer bias plotted against pressure at two different target power levels, 30 kw and 8 kw. As can be seen, at 30 kws of target power, considered to be a 'high' power level wafer bias has a significant effect, whereas at 'low' target power bias has either no significant effect, the differences being considered to be within measurement error.

The magnetron target considered throughout these experiments is of 330 mm diameter, a conventional size for 200 mm wafers and of conventional moving magnet design meaning that there is an erosion path adjacent the magnetic racetrack giving a non-uniform plasma density over the target surface.

We claim:

1. A magnetron sputtering apparatus comprising:
   a target having a target surface at which the target is to be eroded;
   a vacuum chamber in which the target surface is exposed;
   a magnetron assembly for the target, the magnetron assembly including a magnet moveable relative to the target to produce uniform erosion of the target across the target surface;
   a support for holding a substrate onto which a film comprising material from the target is to be deposited;
   a closed loop magnet assembly including a coil whose loops are located outside the vacuum chamber and extend around the perimeter of the target, for magnetically containing or restricting a plasma adjacent to the target surface to alter the pattern of the erosion of the target produced by the magnetron assembly; and a control operatively connected to the magnet assembly and configured to control the magnet assembly to selectively cause the plasma to spread over substantially the entire target surface such that substantially the entire target surface may be eroded and cause the plasma to be confined adjacent to the target surface within an area smaller than that occupied by the plasma when the plasma is spread over substantially the entire target surface.

2. Apparatus as claimed in claim 1 further including a further magnetic assembly located to surround a space above the support.

3. Apparatus as claimed in claim 2 wherein the further magnetic assembly generates a magnetic field of lower strength than the closed loop magnetic assembly.

4. Apparatus as claimed in claim 2 wherein the closed loop magnetic assembly and the further magnetic assembly are operatively connected to separate controls.

5. Apparatus as claimed in claim 2 wherein one or both of the closed loop magnetic assembly and the further magnetic assembly are arranged in a bucking configuration with respect to the magnetron assembly.

6. Apparatus as claimed in claim 2 wherein the further magnetic assembly is a closed loop magnetic assembly including a coil of loops disposed outside and extending around the vacuum chamber.

7. Apparatus as claimed in claim 1 wherein the control is configured to select controlling the magnetic assembly to cause the plasma to spread over substantially the entire target surface when a substrate on the support is shielded from the target or prior to a substrate being placed on the support and to select controlling the magnetic assembly to cause the plasma to be confined adjacent to the target surface within said area when a film is to be deposited on the substrate.

8. Apparatus as claimed in claim 1 wherein the closed loop magnetic assembly is composed of a coil, and a DC power supply connected to the coil.

9. Apparatus as claimed in claim 1 wherein the target is substantially dished shaped.

10. Apparatus as claimed in claim 1 wherein the coil is circumjacent the target surface.

11. Apparatus as claimed in claim 1 wherein the target has a front at which the target surface is presented, and a back, the magnet of the magnetron assembly facing the back of the target.

12. A magnetron sputtering apparatus including: a target having a target surface at which the target is to be eroded; a magnetron assembly for the target, the magnetron assembly including a magnet moveable relative to the target to produce uniform erosion of the target across the target surface;

a support for holding a substrate onto which a film comprising material from the target is to be deposited;

a closed loop magnet assembly including a coil, for magnetically containing or restricting a plasma adjacent to the target surface to alter the pattern of the erosion of the target produced by the magnetron assembly, and wherein the coil is circumjacent the target surface; and a control operatively connected to the magnet assembly and configured to control the magnet assembly to selectively cause the plasma to spread over substantially the entire target surface such that substantially the entire target surface may be eroded and cause the plasma to be confined adjacent to the target surface within an area smaller than that occupied by the plasma when the plasma is spread over substantially the entire target surface.

13. Apparatus as claimed in claim 12 wherein the target has a front at which the target surface is presented, and a back, the magnet of the magnetron assembly facing the back of the target.

14. A method of controlling a magnetron sputtering apparatus including a target having a sputter surface, a vacuum chamber in which the sputter surface is exposed, a magnetron assembly including a magnet moveable with respect to the target, a support for a substrate to be coated using material from the target, a plasma generator and a plasma containment arrangement, said method comprising:

operating the plasma containment arrangement in a first, cleaning mode wherein the plasma extends across substantially the whole sputter surface and a second, deposition mode wherein the plasma is confined adjacent the sputter surface to an area smaller than that when the plasma containment arrangement is operating in the first, cleaning mode, and creating a magnetic containment field in a region around a space located above the support.

15. A method as claimed in claim 14 wherein the operating of the plasma containment arrangement and the creating of the magnetic containment field comprise supplying DC power to a plurality of electro-magnets.

16. A method as claimed in claim 15 wherein the electro-magnets are arranged in a bucking configuration with respect to the magnetron assembly.

17. A method as claimed in claim 14 wherein the plasma containment arrangement is operated in the first mode prior to a deposition process performed by the sputtering apparatus or in-between deposition steps of a deposition process during which steps a substrate is successively coated using material from the target, and the plasma containment arrangement is operated in the second mode during the deposition process or during the deposition steps.

18. A method as claimed in claim 14 wherein the operating of the plasma containment arrangement and the creating of the magnetic containment field comprise generating magnetic fields of different intensities by supplying power to a target coil and to a platen coil, respectively, the target coil extending circumjacent the sputter surface of the target, and the platen coil lying entirely in a region between the first coil and the plane of a surface of the substrate which faces the sputter surface of the target.

19. A method of sputter deposition on a substrate, the method comprising:

carrying out a sputter deposition process in which a substrate disposed on a support is coated, wherein the sputter deposition process comprises generating plasma, eroding a surface of the target using the plasma in the presence of a magnetic field generated by a magnetron assembly, and directing material eroded from the target onto the substrate without the use of a collimation filter; and during the sputter deposition process, restricting the plasma to a central area of the target by creating a magnetic field using a coil circumjacent a surface of the target, and creating a magnetic containment field in a region around a space located above the support.

20. A method as claimed in claim 19 wherein the sputter deposition process is performed in a long throw chamber.

21. A method as claimed in claim 19 wherein a bias is applied to the substrate.

22. A method as claimed in claim 21 performed without the use of a means dedicated to ionize material eroded from the target.

23. A method as claimed in claim 21 further comprising applying power to the magnetron constituted by the target and the magnetron assembly, and controlling the power, the magnetic field used to restrict the plasma to the central area of the target, and the magnetic containment field to at least partially ionize material eroded from the target during the sputtering process.

24. A method as claimed in claim 19 further comprising a cleaning process wherein the plasma is allowed to spread beyond the central area of the target for cleaning the target, when deposition is not taking place.

25. A method as claimed in claim 19 wherein the restricting of the plasma and the creating of the magnetic containment field comprise supplying DC power to a plurality of electro-magnets.

26. A method as claimed in claim 25 wherein the electro-magnets arranged in a bucking configuration with respect to the magnetron assembly.

27. A method as claimed in claim 19 wherein restricting of the plasma and the creating of the magnetic containment field comprise generating magnetic fields of different intensities by supplying power to a target coil and to a platen coil, respectively, the target coil extending circumjacent the surface of the target being eroded, and the platen coil lying entirely in a region between the first coil and the plane of a surface of the substrate which faces the surface of the target.

* * * * *